(12) United States Patent
Qiao et al.

(10) Patent No.: US 10,608,106 B2
(45) Date of Patent: Mar. 31, 2020

(54) POWER SEMICONDUCTOR DEVICES

(71) Applicant: University of Electronic Science and Technology of China, Chengdu (CN)

(72) Inventors: Ming Qiao, Chengdu (CN); Zhengkang Wang, Chengdu (CN); Ruidi Wang, Chengdu (CN); Zhao Qi, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 15/955,706

(22) Filed: Apr. 18, 2018

(65) Prior Publication Data

US 2019/0237576 A1    Aug. 1, 2019

(30) Foreign Application Priority Data

Jan. 30, 2018  (CN) .......................... 2018 1 0088668

(51) Int. Cl.
| | |
|---|---|
| *H01L 29/78* | (2006.01) |
| *H01L 29/423* | (2006.01) |
| *H01L 29/40* | (2006.01) |
| *H01L 29/08* | (2006.01) |
| *H01L 29/10* | (2006.01) |
| *H01L 29/06* | (2006.01) |

(52) U.S. Cl.
CPC ...... *H01L 29/7813* (2013.01); *H01L 29/0852* (2013.01); *H01L 29/1095* (2013.01); *H01L 29/402* (2013.01); *H01L 29/4236* (2013.01); *H01L 29/42372* (2013.01); *H01L 29/7816* (2013.01); *H01L 29/7825* (2013.01); *H01L 29/7833* (2013.01); *H01L 29/063* (2013.01); *H01L 29/0649* (2013.01); *H01L 29/0653* (2013.01)

(58) Field of Classification Search
None
See application file for complete search history.

(56) References Cited

U.S. PATENT DOCUMENTS

| | | |
|---|---|---|
| 5,998,833 A | 12/1999 | Baliga |
| 6,683,346 B2 | 1/2004 | Zeng |

(Continued)

*Primary Examiner* — Telly D Green
(74) *Attorney, Agent, or Firm* — Bayramoglu Law Offices LLC

(57) ABSTRACT

A power semiconductor device including a first conductivity type semiconductor substrate, a drain metal electrode, a first conductivity type semiconductor drift region, and a second conductivity type semiconductor body region. The second conductivity type semiconductor body region includes a first conductivity type semiconductor source region and anti-punch-through structure; the anti-punch-through structure is a second conductivity type semiconductor body contact region or metal structure; the lower surface of the anti-punch-through structure coincides with the upper surface of the first conductivity type semiconductor drift region or the distance between the two is less than 0.5 μm, so that make the device avoid from punch-through. An anti-punch-through structure is introduced at the source end of the device to avoid punch-through breakdown caused by short channel and light-doped body region.

10 Claims, 11 Drawing Sheets

(56) References Cited

U.S. PATENT DOCUMENTS

| | | | |
|---|---|---|---|
| 7,745,878 B2* | 6/2010 | Bhalla | H01L 29/407 257/330 |
| 7,807,576 B2* | 10/2010 | Pan | H01L 29/42368 438/700 |
| 8,110,869 B2* | 2/2012 | Bhalla | H01L 29/0878 257/328 |
| 8,969,958 B1 | 3/2015 | Khemka et al. | |
| 9,275,905 B1* | 3/2016 | Wen | H01L 21/845 |
| 2006/0209887 A1* | 9/2006 | Bhalla | H01L 29/407 370/466 |
| 2007/0267656 A1* | 11/2007 | Yu | H01L 29/0804 257/197 |
| 2009/0072301 A1* | 3/2009 | Bhalla | H01L 29/407 257/328 |
| 2009/0315083 A1* | 12/2009 | Pan | H01L 29/42368 257/280 |
| 2012/0261676 A1* | 10/2012 | Nakano | H01L 29/165 257/77 |
| 2016/0218007 A1* | 7/2016 | Wen | H01L 21/845 |

* cited by examiner

POWER SEMICONDUCTOR DEVICES

CROSS REFERENCE TO RELATED APPLICATIONS

This application is based on and claims priority to the Chinese patent application no. 201810088668.4, filed on Jan. 30, 2018, the entire contents of which are incorporated herein by reference.

TECHNICAL FIELD

The present invention relates to power semiconductor devices, and more particularly to high speed power semiconductor devices.

BACKGROUND

Power semiconductor devices represented by power MOSFETs, such as power LDMOS mid power VDMOS, are widely used in power management systems. In order to reduce conduction losses and switching losses, power MOSFET is typically designed with low specific on-resistance and parasitic capacitance. With the rapid development of power semiconductor industry, the contradictory relationship between breakdown voltage and on-resistance has been relieved by reduced surface field (RESURF) technique and super junction concept. These technologies greatly reduce on-resistance at specific breakdown voltage to reduce the conduction losses induced by on-resistance. However, in the low-voltage and medium-voltage applications, the conduction losses of power semiconductor devices are no longer dominant. With the continuous increase in the operating frequency of power management systems, the switching losses caused by the switching process of the devices account for a higher proportion of the total power consumption. This increases the power consumption of the entire system and reduces its efficiency.

The conventional N-channel trench gate VDMOS, as shown in FIG. 1, whose gate structure extends through the P-body region and into the low-doped drift region so that it eliminates the JFET region resistance of conventional planar gate VDMOS. Furthermore, gate field plate can form a multi-sub accumulation layer of majority carriers in the drift region to reduce on-resistance at positive bias. However, the parasitic capacitance $C_{GD}$ caused by gate-drain overlap reduces switching speed and increases dynamic power consumption.

In order to reduce switching losses, a series of improved structures have been proposed to reduce the gate-drain parasitic capacitance $C_{GD}$ of the conventional trench gate VDMOS. As shown in FIG. 2, utilizing a thick oxide layer at the bottom of the trench gate effectively increases the distance between gate and drift region, and thus reducing the gate-drain parasitic capacitance $C_{GD}$. For deep trench VDMOS devices, stepped gate electrodes and oxide layers can be used in deep trenches in order to reduce the gate-drain parasitic capacitance $C_{GD}$, as shown in FIG. 3. B. J. Baliga proposed a deep trench VDMOS device based on a split gate structure in U.S. Pat. No. 5,998,833. The deep trench includes a control gate electrode isolated by dielectric and a separated gate electrode having the same potential as the source electrode. The separated electrode is used to shield the capacitive coupling effect between the control gate electrode and the drift region to reduce the gate-drain parasitic capacitance $C_{GD}$. The structure is shown in FIG. 4; the deep trench VDMOS structure proposed by J. Zeng in U.S. Pat. No. 6,683,346 also applies the same principle, a dielectric layer is used to isolate the channel region control gate from the gate structure at the end of the trench gate to reduce the gate-drain parasitic capacitance $C_{GD}$.

FIG. 21 shows a cross-sectional schematic view of the conventional N-channel planar gate LDMOS, whose gate electrode extends to drain side and covers a portion of the shallow trench isolation (STI) located in the drift region to form a gate field plate. The gate field plate improves breakdown voltage by adjusting device surface electric field. Meanwhile, the gate field plate forms a multi-sub accumulation layer of majority carriers on the surface of the drift region to further reduce on-resistance. However, the longer gate field plate also increases the overlap between gate and drift region, which leads to a larger gate-drain parasitic capacitance $C_{GD}$, thereby increasing device twitching time and dynamic power consumption.

To achieve lower gate-drain parasitic capacitance $C_{GD}$ of the conventional N-channel planar gate LDMOS. Vishnu Kbemka et. al proposed a split gate structure based on lateral power devices in U.S. Pat. No. 8,969,958, as shown in FIG. 22. This structure forms a control gate and a split gate whose potential is equal to source electrode, by separating the gate field plate of the conventional LDMOS device. The split gate structure reduces gate-drain overlap, and shields the capacitive coupling effect between control gate electrode and drift region, thereby significantly reducing the gate-drain parasitic capacitance $C_{GD}$ and improving the switching performance but without the influence of device's breakdown voltage.

Prior art method of reducing gate-drain parasitic capacitance $C_{GD}$ is typically focusing on optimizing the gate structure except for the control gate to reduce the dynamic power consumption. However, the charging and discharging process of the parasitic gale-source and gate-drain capacitance near the channel region of the power MOSFET device still have great impact on device switching characteristic. Therefore, there is still plenty of room for optimization and improvement in source end structure near the channel region, so as to further improve the switching speed and reduce the dynamic power consumption of device.

SUMMARY

The present invention proposes various power semiconductor devices to improve the switching speed and reduce the dynamic loss of the power MOSFET device based on the prior art. The device proposed by the present invention uses an improved source end structure and matched gate and drift region structures. The device structure provided by the present invention has smaller gate-source and gate-drain parasitic capacitances than conventional devices, and can effectively shorten the switching time and increase the switching speed without substantially affecting the off-state withstand voltage and on-resistance of the device, thereby achieving the purpose of reducing the switching losses of the device.

In order to achieve the objective of the above-mentioned invention, the technical solution is as follows:

A power semiconductor device includes a first conductivity type semiconductor substrate 9, a drain metal electrode 10 connected to the bottom of the first conductivity type semiconductor substrate 9, a first conductivity type semiconductor drift region 8 disposed on the upper surface of the first conductivity type semiconductor substrate 9, a second conductivity type semiconductor body region 5 disposed on the upper surface of the first conductivity type semiconductor drift region 8 and a first conductivity type semiconductor source region 6 and an anti-punch-through structure 7 disposed inside the second conductivity type semiconductor body region 5; the anti-punch-through structure 7 is a second conductivity type semiconductor body contact region; a source metal electrode 1 disposed on the surface of the device connects the first conductivity type semiconductor source region 6 and the anti-punch-through structure 7, and the lower surface of the anti-punch-through structure 7 coincides with the upper surface of the first conductivity type semiconductor drift region 8 or the distance between the lower surface of anti-punch-through structure 7 and the upper surface of the first conductivity type semiconductor drift region 8 is less than 0.5 µm to prevent punch-through breakdown; a dielectric layer 13 extends through the second conductivity type semiconductor body region 5 and into the first conductive type semiconductor drift region 8; a control gate electrode 2 is disposed in the dielectric layer 13; a gate dielectric 12 is formed by the dielectric layer between the control gate electrode 2 and the second conductivity type semiconductor body region 5 and the first conductivity type semiconductor drift region 8.

Preferably, the distance between the anti-punch-through structure 7 and gate dielectric 12 is less than 0.3 µm; and/or the thickness of gate dielectric 12 between the control gate electrode 2 and the second conductivity type semiconductor body region 5 and the first conductivity type semiconductor drift region 8 is greater than 0.05 µm.

Preferably, the doping concentration of the second conductivity type semiconductor body region 5 is less than $10^{15}$ $cm^{-3}$.

Preferably, the part of the second conductivity type semiconductor body region 5 between the first conductivity type semiconductor source region 6 and the first conductivity type semiconductor drift region 8 and near the gate dielectric 12 is a conduction channel region when the device is tinned on, and the length of the conduction channel region is less than 0.5 µm.

Preferably, the upper surface of the control gate electrode 2 is not higher than the lower surface of the first conductivity type semiconductor source region 6; and/or the lower surface of the control gate electrode 2 is not lower than the upper surface of the first conductivity type semiconductor drift region 8.

Preferably, when the anti-punch-through structure 7 is a metal structure, a short-circuited region 15 is disposed inside the second conductivity type semiconductor body region 5, and the short-circuited region 15 is in contact with the first conductivity type semiconductor source region 6 and the metal structure.

Preferably, the control gate electrode 2 is divided into a first electrode 2a and a second electrode 2b.

Preferably, the second source electrode 3 is disposed below the control gate electrode 2 of the dielectric layer 13.

Preferably, the second source electrode 3 is disposed below the control gate electrode 2 of the dielectric layer 13, and the lower surface of the control gate electrode 2 is higher than the upper surface of the first conductivity type semiconductor drift region 8.

Preferably, the control gate electrode 2 is divided into a first electrode 2a and a second electrode 2b; a second source electrode 3 is disposed below the control gate electrode 2 of the dielectric layer 13.

Preferably, the second source electrode 3 is disposed below the control gate electrode 2 of the dielectric layer 13, and the control gate electrode is divided into the first electrode 2a and the second electrode 2b, and the upper surface of the second source electrode 3 is in contact with the source metal electrode 1.

Preferably, the second source electrode 3 is disposed below the control gate electrode 2 of the dielectric layer 13. In the first conductivity type semiconductor drift region 8, alternately distributed second conductivity type strip region 11a and first conductivity type strip region 11b are provided.

To achieve the above objective, the present invention also provides a second power semiconductor device:

The second power semiconductor device includes a second conductivity type semiconductor substrate 19 having a first conductivity type semiconductor drift region 8 on the upper surface. On the right side of the first conductivity type semiconductor drift region 8, a first conductivity type drain contact region 4 is disposed, and the first conductivity type drain contact region 4 is connected to the drain metal electrode 10 at the top. On the left side of the first conductivity type semiconductor drift region 8, a second conductivity type semiconductor body region 5 is disposed. On the surface of the first conductivity type semiconductor drift region 8, a dielectric layer 13 is disposed. A conductivity type semiconductor source region 6 and an anti-punch-through structure 7 are disposed inside the second conductivity type semiconductor body region 5; the anti-punch-through structure 7 is a second conductivity type semiconductor body contact region, and the right boundary of the anti-punch-through structure 7 and the right boundary of the second conductivity type semiconductor body region 5 coincide or the distance between the two is less than 0.5 µm; the first conductivity type semiconductor source region 6 and the anti-punch-through structure 7 are short-circuited by the source metal electrode 1, a gate dielectric 12 is disposed on the upper surface of the second conductivity type semiconductor body region 5, and the region of the second conductivity type semiconductor body region 5 near the gate dielectric 12 and between the first conductivity type semiconductor source region 6 and the first conductivity type semiconductor drift region 8 is the conduction channel region when the device is turned on. The length of the conduction channel region is less than 0.5 µm. The control gate electrode 2 and the second source electrode 3 are respectively disposed on the gate dielectric 12 and the dielectric layer 13. The potential of the source electrode 3 is substantially equivalent to the potential of the source metal electrode 1. The doping concentration of the second conductivity type semiconductor body region 5 is less than $10^{15}$ $cm^{-3}$; the thickness of the gate dielectric 12 between the control gate electrode 2 and the second conductivity type semiconductor hotly region 5 is greater than 0.05 µm.

The proposed devices according to the present invention have special design in source end structure, including source region, body region and gate structure. An anti-punch-through structure is introduced into the body region, potential of the anti-punch-through structure can be obtained by connecting to the source electrode or a specific potential. The anti-punch-through structure requires sufficient electrical conductivity and can be achieved by a high-doped region with a same doping type as the body region or other low-resistance material, such as metal. Meanwhile, the anti-punch-through structure is necessarily designed with a certain degree of overlap with on-state channel region and distance to the silicon/gate dielectric interface. When the overlap is small, or the anti-punch-through structure is at a large distance from the silicon/gate dielectric interface, punch-through breakdown occurs. However, when the distance from the silicon/gate dielectric interface is too small, the device threshold voltage increases. Therefore, the anti-punch-through structure is typically implemented as a high-doped region or a trench metal structure extending into the body region near the channel region. In device off state, the anti-punch-through structure can clamp the low potential to the body drift junction, and by cooperating with the low-potential gate electrode, form a parasitic JFET region in the body region. The introduction of the parasitic JFET region greatly reduces device's punch-through current, thereby improving the anti-punch-through capability of the device. Based on the anti-punch-through structure, by simultaneously shortening channel length and reducing overlap between the channel and gate electrode, gate parasitic capacitance is remarkably reduced. The shorter channel length also contributes to reduce the channel resistance of the device. Besides, the gate structure according to the present invention further reduces the gate parasitic capacitance by using thick gate dielectric layer while maintaining threshold voltage by reducing the doping concentration of the channel area. Owing to the anti-punch-through effect of the parasitic JFET area, the short channel region and the light-doped channel regions employed in the present invention do not affect the device's withstand voltage performance, and at the same time reduce the device's gate parasitic capacitance.

Beneficial effects of the present invention are as follows. Compared to the conventional MOSFET device, gate parasitic capacitance of the device provided by the present invention is greatly reduced, due to the smaller gate overlap area, and the larger parasitic gate-source and gate-drain capacitance equivalent distance. Meanwhile, the anti-punch-though structure is introduced to the source end structure to avoid the punch-though breakdown caused by the short channel and light-doped body region. The source end structure and the corresponding design concept can be applied to a variety of power semiconductor devices and improved structures thereof.

Figure 1:
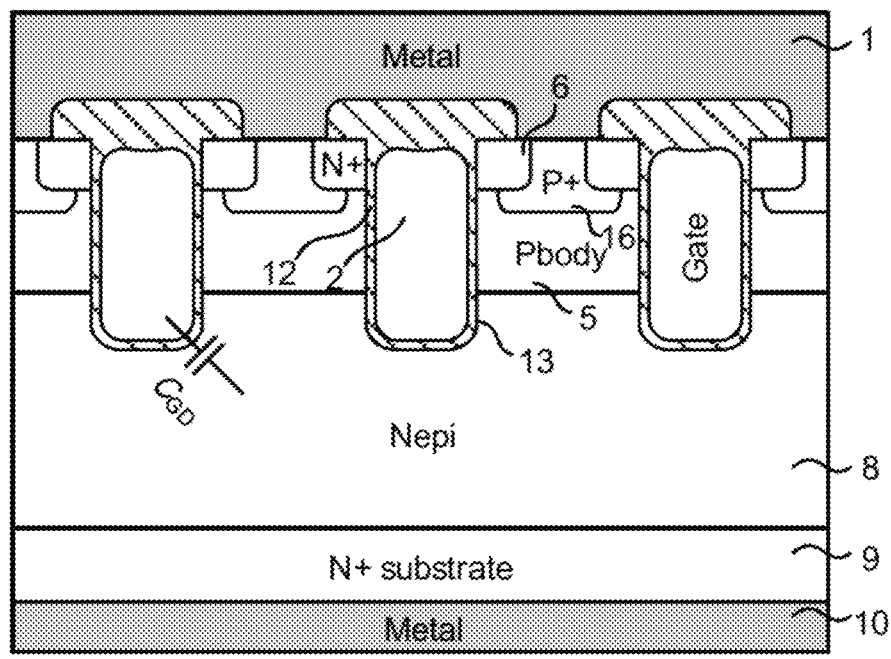
FIG. 1 is a schematic diagram of a conventional trench gate VDMOS device.

In the drawings, 1 is the source metal electrode, 2 the control gate electrode, 2a is the first electrode, 2b is the second electrode, 3 is the second source electrode, 4 is the first conductivity type drain contact region, 5 is the second conductivity type semiconductor body region, 6 is the first conductivity type semiconductor source region, 7 is the anti-punch-through structure, 8 is the first conductivity type semiconductor drift region, 9 is the first conductivity type semiconductor substrate, 10 is the drain metal electrode, 11a is the second conductivity type strip region, 11b is the first conductivity type strip region, 12 is the gate dielectric, 13 is the dielectric layer, 15 is the short-circuited region, 16 is the second conductivity type semiconductor body contact region, 19 is the second conductivity type semiconductor substrate.

DETAILED DESCRIPTION OF THE EMBODIMENTS

The following specific examples illustrate embodiments of the invention, and those skilled in this field can easily understand the other advantages and effects of the invention by the content disclosed in this specification. The invention can also be implemented or applied by different concrete embodiments, and the details can be based on different viewpoints and applications, within the spirit of the invention without any modification or alteration.

FIG. 1 shows a conventional trench gate VDMOS device. The conventional trench gate VDMOS device include a first conductivity type semiconductor substrate 9, and a first conductivity type semiconductor drift region 8 is disposed on the surface of the first conductivity type semiconductor substrate 9, a drain metal electrode 10 is connected to the bottom of the first conductivity type semiconductor substrate 9; a second conductivity type semiconductor body region 5 is disposed on the surface of the first conductivity type semiconductor drift region 8; a first conductivity type semiconductor source region 6 and a second conductivity type semiconductor body contact region 16 are disposed in the second conductivity type semiconductor body region 5; a dielectric layer 13 extends through the second conductivity type semiconductor body region 5 and into the first conductive type semiconductor drift region 8; a control gate electrode 2 is disposed in the dielectric layer 13; dielectric layer between the control gate electrode 2 and the second conductivity type semiconductor body region 5 and the first conductivity type semiconductor drift region 8 is gate dielectric 12.

The conventional trench gate N-type VDMOS performs groove carving on the device snake, sacrificial oxygen growth and etching, and then grows the oxide layer to obtain the gate dielectric 12, and finally deposits the polysilicon to form the control gate electrode 2, thereby obtaining a trench gate structure at the top of the device. When the device is turned on, a positive bias voltage is applied to the control gate electrode 2, and an inversion layer can be formed in a region near the silicon/gate dielectric interface in the second conductivity type semiconductor body region 5. The region where the inversion layer is formed is referred to as a device conduction channel region. The low resistance conductive path formed between the first conductive type semiconductor source region 6 and the first conductive type semiconductor drift region 8 enables the device to be turned on. Furthermore, the portion of the dielectric layer 13 extending into the first conductivity type semiconductor drift region 8 can also attract majority carriers in the first conductivity type semiconductor drift region 8 to form a multi-sub accumulation layer when the device is in the on state, thereby reducing the on-resistance of the device. Since the channel region is located in the body, the trench gate VDMOS does not have the JFET region formed by depletion of the planar gate VDMOS body region and the drift region and the resulting JFET region resistance, but the control gate electrode 2 extends into the drift region to cause a large gate-drain parasitic capacitance $C_{GD}$, degrading device dynamic performance, and increasing switching time and dynamic power consumption.

Figure 2:
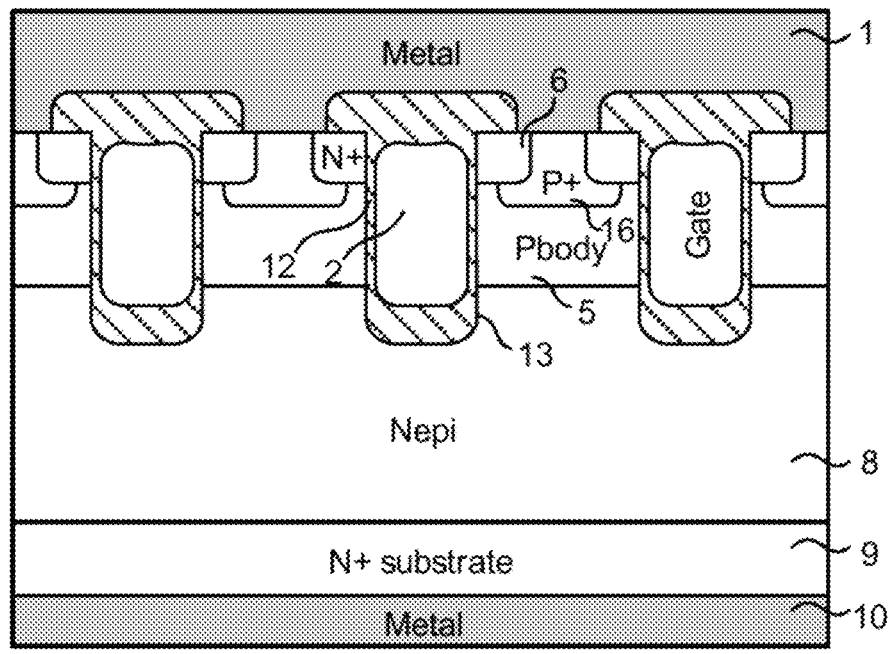
FIG. 2 is a schematic diagram of a trench gate VDMOS device with thick oxide at the bottom of trench gate.

The device shown in FIG. 2 is essentially the same as the device shown in FIG. 1, the only difference is that the bottom of the dielectric layer 13 of the device shown in FIG. 2 uses a thicker oxide layer instead of gate oxide, so the dielectric layer between the control gate electrode 2 and the first conductive type semiconductor drift region 8 is thicker and the gate-drain parasitic capacitance $C_{GD}$ compared to the device in FIG. 1 has been reduced, thereby the dynamic characteristics have been improved.

Figure 3:
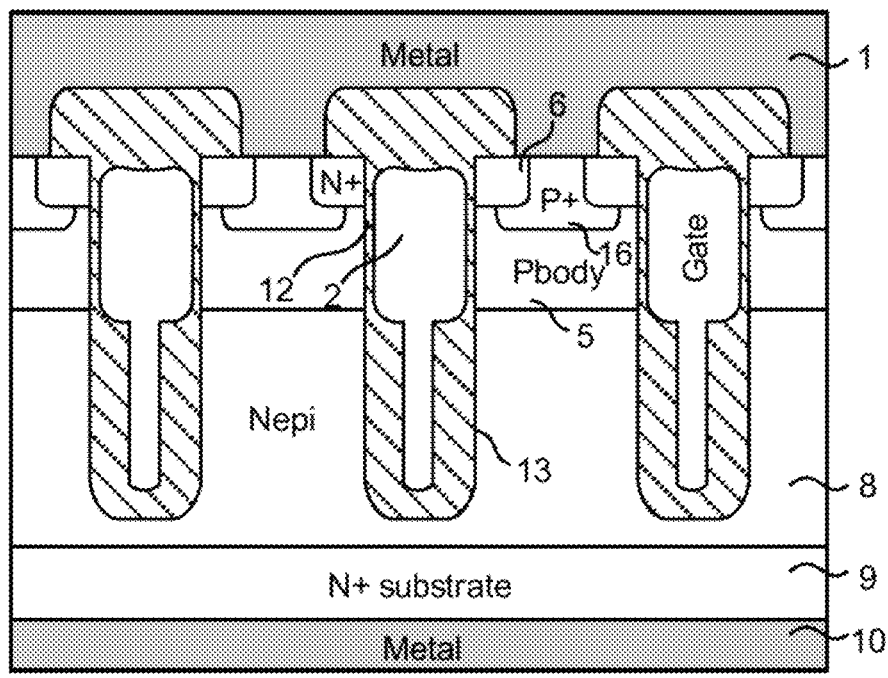
FIG. 3 is a schematic diagram of a deep trench VDMOS device with stepped gate.

FIG. 3 shows a schematic diagram of a deep trench VDMOS device with stepped gate, the difference between the structure shown in FIG. 3 and the device shown in FIG. 1 is that the bottom of the dielectric layer 13 of the device shown in FIG. 3 is closer to the first conductivity type semiconductor substrate 9, and thus the overlapping area of the gate and the drift region is larger. The control gate electrode 2 can assist the depletion of the first conductive type semiconductor drift region 8 when the device withstands the voltage, thus increasing the impurity concentration of the first conductive type semiconductor drift region 8 and further reducing on-resistance of the device. Due to the overlap of the control gate electrode 2 and the first conductivity-type semiconductor drift region 8, the control gate electrode 2 can also form a longer multi-sub accumulation layer in the drift region when the device is turned on, so that on-resistance of the device is further reduced. However, the large overlap area of the gate drift region also leads to a larger gate-drain parasitic capacitance $C_{GD}$, which seriously degrades the dynamic performance of the device. In order to reduce the impact of gate-drain parasitic capacitance $C_{GD}$ on device dynamic characteristic, step-shaped control gate electrodes 2 are formed by performing groove carving on the device surface, sacrificial oxygen growth and etching, re-growing an oxide layer, polysilicon deposition, and the like. By increasing the thickness of the gate dielectric in the drift region, the gate-drain parasitic capacitance $C_{GD}$ caused by the control gate electrode 2 extending into the first conductivity-type semiconductor drift region 8 is reduced, while the thickness of the gate dielectric near the channel region remains unchanged, thereby having no impact on the threshold voltage. However, the gate-drain parasitic capacitance $C_{GD}$ is still large and has a significant impact on device's switching speed and dynamic loss.

Figure 4:
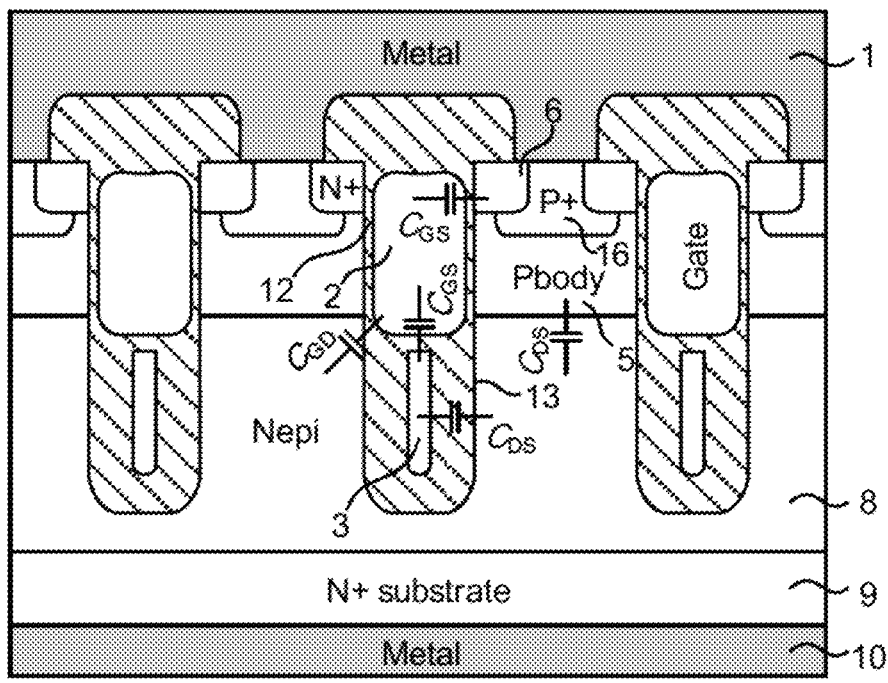
FIG. 4 is a schematic diagram of a trench gate VDMOS deuce with split gate structure.

FIG. 4 shows a schematic diagram of a trench gate VDMOS device with split gate structure, the main difference between the device in FIG. 4 and the deep trench VDMOS shown in FIG. 3 is that the control gate electrode 2 does not adopt a stepped design, but the second source electrode 3 is first obtained in the dielectric layer 13 through oxygen growth, oxygen deposition, polysilicon deposition, and etching. Next, the gate dielectric 12 and the control gate electrode 2 are obtained by depositing dielectric layer and subsequently using a conventional manufacturing process, and the control gate electrode 2 and the second source electrode 3 are separated by the dielectric layer. The length of control gate electrode 2 just covers the conduction channel region between source and drift region. Although the device has the same deep trench structure as the device shown in FIG. 3, the difference is that the introduction of the second source electrode 3 shields the capacitive coupling effect between control gate electrode 2 and first conductive type semiconductor drift region 8, thereby significantly improving the gate-drain parasitic capacitance $C_{GD}$ and reducing device's switching time and dynamic power consumption. The dielectric layer 13 can still function to optimize breakdown voltage and on-resistance, but the control gate electrode 2 is unable to form accumulate layer in the drift region in the on state, thus the on-resistance is increased compared with the device shown in FIG. 3. It can be seen that the device shown in this figure and the stepped gate device shown in FIG. 3 are both improvements to the gate structure other than the device control gate in order to reduce gate-drain parasitic capacitance $C_{GD}$ of the device.

According to the split gate concept described above, other improved or modified device structures have also been produced. However, the performance of these improved or modified structures based on the split gate devices is very limited. At the same time, the charging and discharging process of the gate-source and gate-drain parasitic capacitance $C_{GD}$ of the power MOSFET devices channel region still seriously affect the switching performance of the device. Therefore, there is still plenty of room for optimization and improvement in the source end structure to further improve the switching speed and reduce the dynamic power consumption of the device.

Embodiment 1

Figure 5:
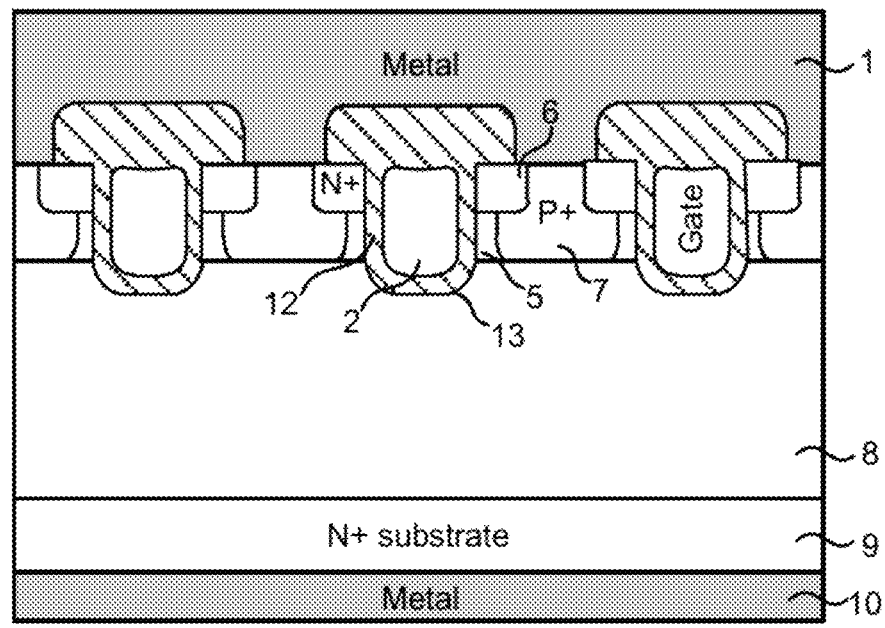
FIG. 5 is a schematic diagram of a trench gate VDMOS device of Embodiment 1 according to the present invention.

As shown in FIG. 5, a power semiconductor device includes a first conductivity type semiconductor substrate 9, a drain metal electrode 10 connected to the bottom of the first conductivity type semiconductor substrate 9, a first conductivity type semiconductor drift region 8 disposed on the upper surface of the first conductivity type semiconductor substrate 9, a second conductivity type semiconductor body region 5 disposed on the upper surface of the first conductivity type semiconductor drift region 8 and a first conductivity type semiconductor source region 6 and an anti-punch-through structure 7 disposed inside the second conductivity type semiconductor body region 5; the anti-punch-through structure 7 is a second conductivity type semiconductor body contact region; a source metal electrode 1 disposed on the surface of the device connects the first conductivity type semiconductor source region 6 and the anti-punch-through structure 7, and the lower surface of the anti-punch-through structure 7 coincides with the upper surface of the first conductivity type semiconductor drift region 8 or the distance between the lower surface of anti-punch-through structure 7 and the upper surface of the first conductivity type semiconductor drift region 8 is less than 0.5 µm to prevent punch-through breakdown; a dielectric layer 13 extends through the second conductivity type semiconductor body region 5 and into the first conductive type semiconductor drift region 8; a control gate electrode 2 is disposed in the dielectric layer 13; a gate dielectric 12 is formed by the dielectric layer between the control gate electrode 2 and the second conductivity type semiconductor body region 5 and the first conductivity type semiconductor drift region 8.

The distance between the anti-punch-through structure 7 and gate dielectric 12 is less than 0.3 µm; and/or the thickness of gate dielectric 12 between the control gate electrode 2 and the second conductivity type semiconductor body region 5 and the first conductivity type semiconductor drift region 8 is greater than 0.05 µm.

The doping concentration of the second conductivity type semiconductor body region 5 is less than $10^{15}$ cm$^{-3}$.

The part of the second conductivity type semiconductor body region 5 between the first conductivity type semiconductor source region 6 and the first conductivity type semiconductor drift region 8 and near the gate dielectric 12 is a conduction channel region when the device is turned on, and the length of the conduction channel region is less than 0.5 µm.

The above scheme shows a VDMOS device proposed by the present invention. The anti-punch-through structure 7 in the body region is a second conductivity type semiconductor body contact region. In the off state of the device, the anti-punch-through structure 7 can clamp the low potential to the junction of the second conductivity type semiconductor body region 5/the first conductivity type semiconductor drift region 8 and cooperate with the control gate electrode 2 of the low potential to form a parasitic JFET region in the second conductivity type semiconductor body region 5 of the device. The introduction of the parasitic JFET region greatly reduces device's punch-through current, thereby increasing the device's anti-punch-through capability. Based on the anti-punch-through capability of the parasitic JFET region, the device can use a shorter channel length design than comparable conventional device structures, and the length of the corresponding control gate electrode 2 can also be shortened, reducing the gate parasitic capacitance and channel resistance; using of a thick gate dielectric 12 further reduces the gate parasitic capacitance; by reducing the doping concentration of the second conductivity type semiconductor body region 5 in combination with the anti-punch-through structure 7 introduced in the body region, the same threshold voltage as the comparable conventional device is maintained; the anti-punch-through structure 7 in the second conductivity type semiconductor body region 5 can also suppress the opening of the parasitic BJT and increase the safe operation area of the device.

Figure 6:
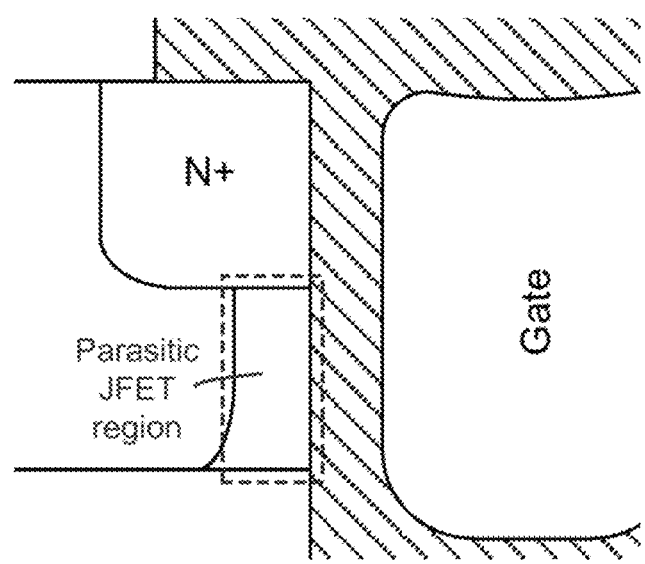
FIG. 6 is a schematic diagram of the partial source end structure of FIG. 5.

FIG. 6 shows the partial source end structure of the trench gate VDMOS device shown in FIG. 5. The region near the gate dielectric 12 in the second conductivity type semiconductor body region 5 is the conduction channel region when the device is turned on. When the device is turned off, both the gate potential and the source potential are low potential. Since the anti-punch-through structure 7 uses a high doping concentration, potential of the anti-punch-through structure 7 is substantially the same as that of the source electrode. The anti-punch-through structure 7 and the control gate electrode 2 will form a parasitic JFET region at the position as shown in the figure, preventing device punch-through breakdown caused by depletion of the low-doped second conductive type semiconductor body region 5 in a withstand voltage state. It should be noted that only when the anti-punch-through structure 7 is properly positioned, the parasitic JFET region can exert sufficient anti-punch-through effect. When the anti-punch-through structure 7 and the gate dielectric 12 are at a large distance or the overlap area is insufficient, the anti-punch-through capability of the parasitic JFET region is weakened, thereby causing device punch-through breakdown. On the other hand, when the punch through structure 7 is too close to the gate dielectric 12, the threshold voltage of the device increases.

Embodiment 2

The difference between the present embodiment and Embodiment 1 lies in that the upper surface of the control gate electrode 2 is not higher than the lower surface of the first conductivity type semiconductor source region 6; the overlap area of the gate and the first conductivity type semiconductor source region 6 is smaller, thus reducing the gate parasitic capacitance.

Embodiment 3

The difference between the present embodiment and Embodiment 1 lies in that the lower surface of the control gate electrode 2 is not lower than the upper surface of the first conductivity type semiconductor drift region 8. The overlap area of the gate and the first conductivity type semiconductor drift region 8 is smaller, thereby reducing the gate parasitic capacitance.

Embodiment 4

Figure 7:
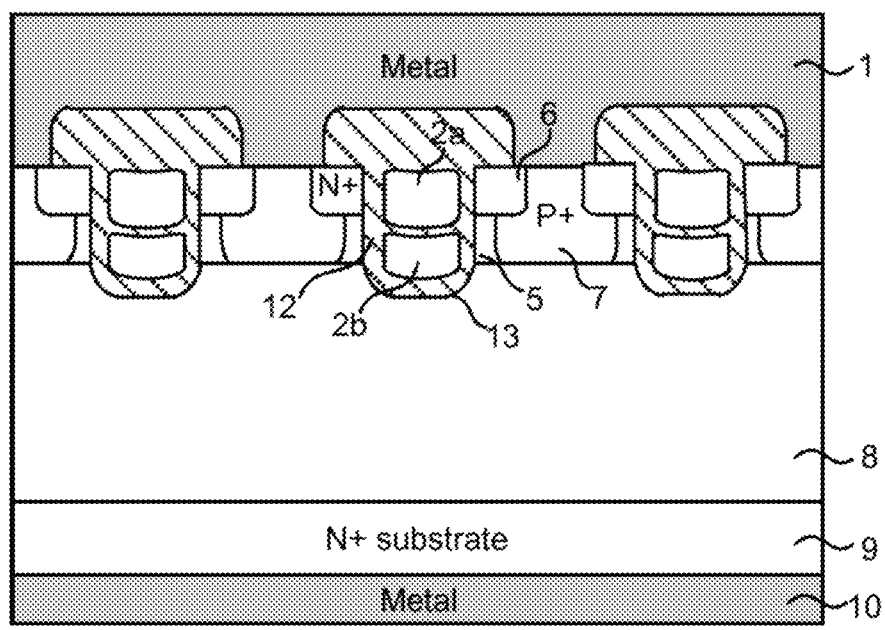
FIG. 7 is a schematic diagram of a trench gate VDMOS device with separated gate structure of Embodiment 4 according to the present invention.

As shown in FIG. 7, the difference between the present embodiment and Embodiment 1 lies in the control gate electrode is divided into a first electrode 2a and a second electrode 2b.

FIG. 7 shows a schematic diagram of a trench gate VDMOS device with separated gate structure proposed by the present invention. In the present embodiment, the first electrode 2a and the second electrode 2b are all connected with the same gate potential. Selecting a suitable distance between the two control gates can form a complete inversion layer channel in the on state of the device to ensure the device conduction. Because there is a certain distance between the two control gate electrodes, compared with the complete control gate structure in the structure of FIG. 5, the overlap area of the gate and the body region is smaller, thereby reducing the parasitic capacitance between the gate and the body region.

Embodiment 5

Figure 8:
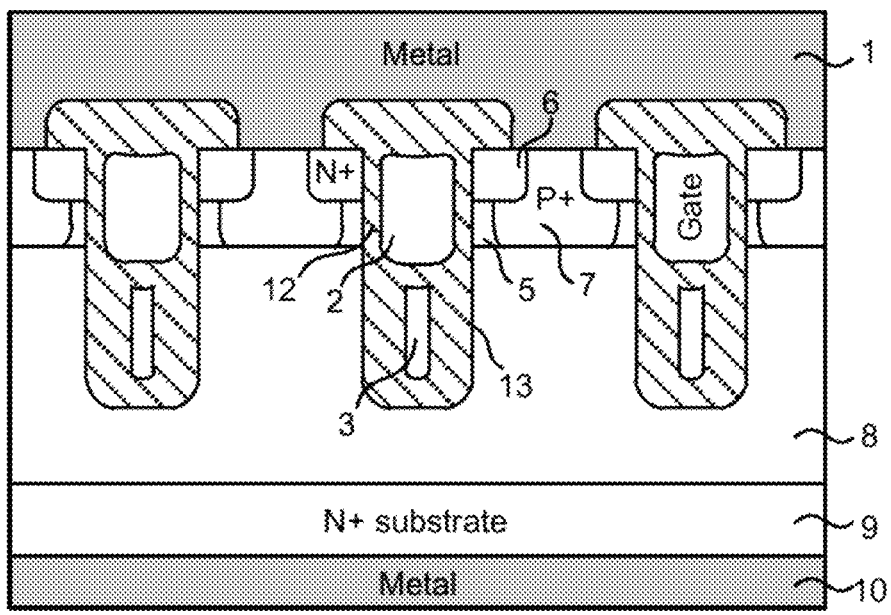
FIG. 8 is a schematic diagram of a trench gate VDMOS device with split gate of Embodiment 5 according to the present invention.

As shown in FIG. 8, the difference between the present embodiment and Embodiment 1 lies in that a second source electrode 3 is disposed below the control gate electrode 2 in the dielectric layer 13.

FIG. 8 is a schematic diagram of a split gate trench VDMOS device proposed by the present invention. The control gate electrode 2 in the dielectric layer 13 and the second source electrode 3 in the deep drift region are isolated from each other by the dielectric layer. In the off state of the device, the second source electrode 3 will introduce a high electric field peak in the drift region, so a portion of the deep trenches extending into the drift region uses a thicker lateral medium and a bottom dielectric layer to prevent the device from having avalanche breakdown in the overlapping region of the second source electrode 3 and the first conductivity type semiconductor drift region 8. The high electric field peak generated in drift region by the second source electrode 3 also makes the electric field distribution of the drift region more uniform under the off state operating condition. Compared with the device structure shown in FIG. 5, the second source electrode 3 shields the capacitive coupling effect between the control gate electrode 2 and the first conductivity type semiconductor drift region 8 and the parasitic gate-drain capacitance $C_{GD}$ is further reduced.

Figure 9:
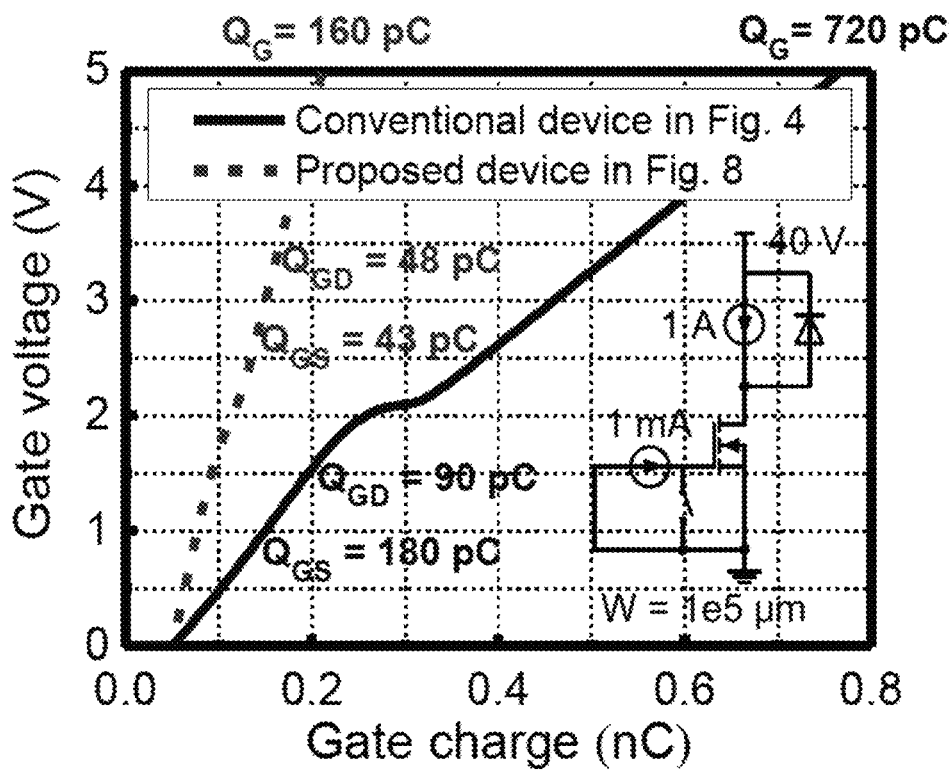
FIG. 9 shows gate charge characteristic curves of the devices in FIG. 4 and FIG. 8.

Table 1 shows the simulation parameters for the devices shown FIG. 4 and FIG. 8. It can be seen that the body region doping concentration and the channel region length of the device proposed in the present invention are all than that of the conventional devices, and the device's threshold voltage, breakdown voltage, and specific on-resistance are not affected by the source end structure. FIG. 9 shows the gate charge characteristic curves of the devices shown in FIG. 4 and FIG. 8. It can be seen that the device of the present invention has a much lower gate charge than the conventional devices.

TABLE 1

| Parameter | Conventional device in FIG. 4 | Proposed device in FIG. 8 |
| --- | --- | --- |
| Source and drain doping | 1e20 cm$^{-3}$ | 1e20 cm$^{-3}$ |
| Pbody doping | 1.6e17 cm$^{-3}$ | 1e15 cm$^{-3}$ |
| Ndrift doping | 1.7e16 cm$^{-3}$ | 1.7e16 cm$^{-3}$ |
| Ndrift region length | 2 μm | 2 μm |
| Trench width | 0.25 μm | 0.25 μm |
| Trench depth | 0.7 μm | 0.7 μm |
| Half-cell pitch | 0.65 μm | 0.65 μm |
| Bottom oxide thickness | 0.2 μm | 0.2 μm |
| Gap oxide thickness | 0.15 μm | 0.15 μm |
| Sidewall oxide thickness | 0.15 μm | 0.15 μm |
| Gate oxide thickness | 20 nm | 75 nm |
| Channel region length | 0.5 μm | 0.2 μm |
| Channel region thickness | / | 0.1 μm |
| Threshold voltage ($V_T$) | 1.5 V | 1.5 V |
| Specific on-resistance | 0.1 mΩ·cm$^2$ | 0.1 mΩ·cm$^2$ |
| Breakdown voltage | 51 V | 50 V |

Embodiment 6

Figure 10:
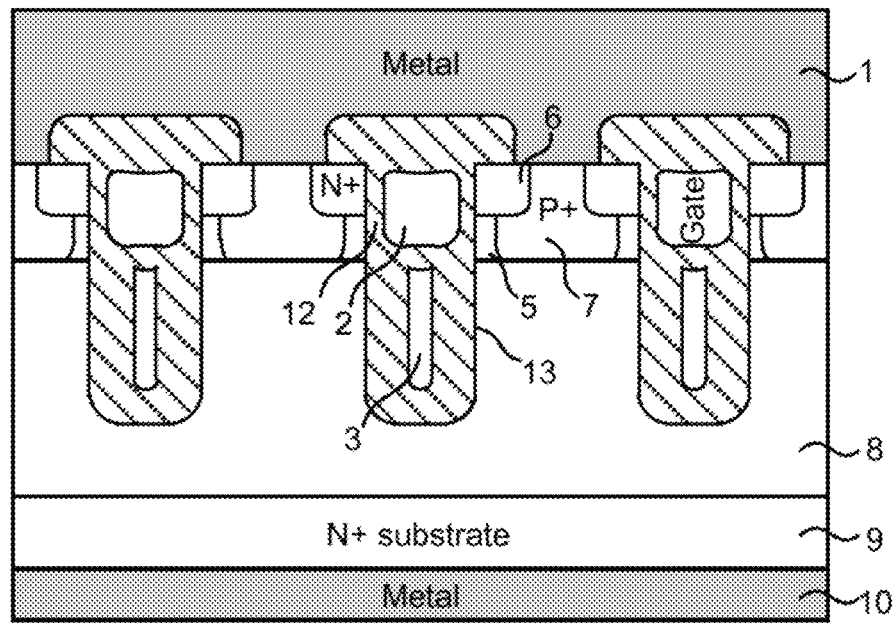
FIG. 10 is a schematic diagram of a split gate trench gate VDMOS device that gate bodies are not completely overlapped of Embodiment 6 according to the present invention.

As shown in FIG. 10, the difference between the present embodiment and Embodiment 1 lies in that the second source electrode 3 is disposed below the control gate electrode 2 in the dielectric layer 13. The lower surface of the control gate electrode 2 is higher than the upper surface of the first conductivity type semiconductor drift region 8.

FIG. 10 shows a schematic diagram of a split gate trench gate VDMOS device in which the gate body is not completely overlapped in the present embodiment. In the device shown in this figure, the control gate electrode 2 does not completely cover the channel region. Because the device proposed by the present invention has a low doping concentration in the channel region, the gate structure can still form a complete inversion layer channel in the body region to make the device conductive in the on-state. Compared with the device shown in FIG. 8, the overlap area between the gate and the channel region is further reduced by introducing a shorter control gate electrode 2, thereby reducing the gate-source parasitic capacitance of the device; the short control gate electrode 2 simultaneously increases the distance between the gate and the drift region, further reducing the gate-drain parasitic capacitance $C_{GD}$.

Embodiment 7

Figure 11:
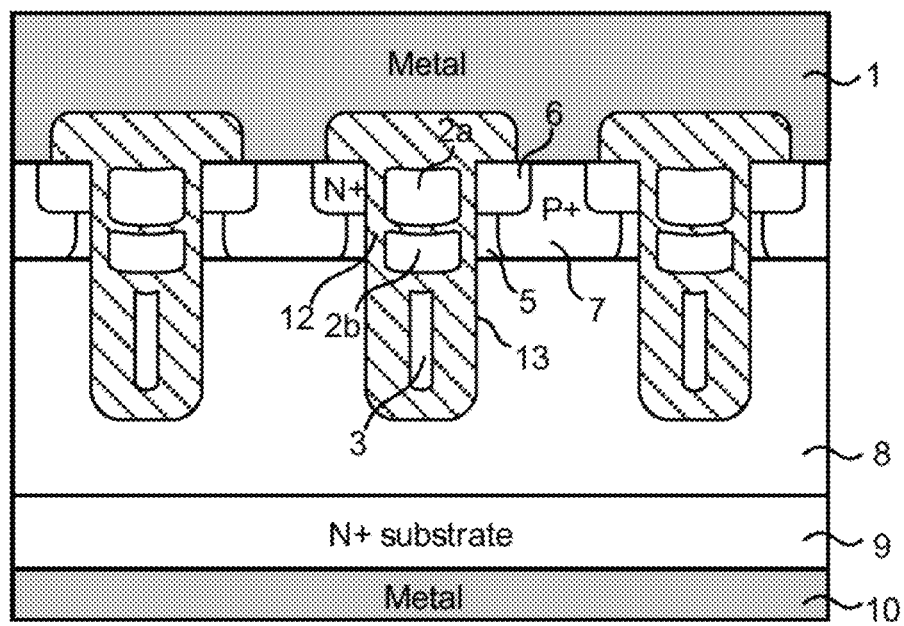
FIG. 11 is a schematic diagram of a split gate trench gate VDMOS device with separated gate structure of Embodiment 7 according to the present invention.

As shown in FIG. 11, the difference between the present embodiment and Embodiment 1 lies in that the control gate electrode is divided into the first electrode 2a and the second electrode 2b, and the second source electrode 3 is disposed below the control gate electrode 2 in the dielectric layer 13.

FIG. 11 shows a schematic diagram of a split gate trench gate VDMOS device with separated gate structure proposed in the present embodiment. In the present embodiment, the control gate electrode is divided into two parts of the first electrode 2a and the second electrode 2b. Both control gates are connected with the same gate potential. Selecting a suitable distance between the two control gates can form a complete inversion layer channel in the on state of the device to ensure the device conduction. Because there is a certain distance between the two control gates, compared with the complete control gate structure shown in FIG. 8, the overlap area between the gate and the body region is smaller, thereby reducing the parasitic capacitance between the gate and the body region.

Embodiment 8

Figure 12:
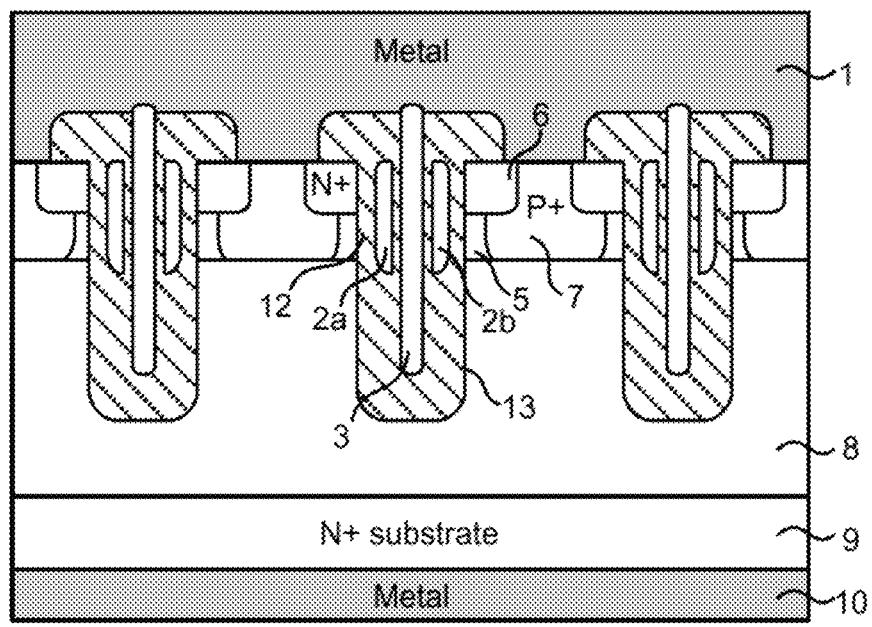
FIG. 12 is a schematic diagram of a trench gate VDMOS device of Embodiment 8 according to the present invention.

As shown in FIG. 12, the difference between the present embodiment and Embodiment 1 lies in that the second source electrode 3 is disposed below the control gate electrode 2 of the dielectric layer 13, and the control gate electrode is divided into the first electrode 2a and the second electrode 2b, and the upper surface of the second source electrode 3 is in contact with the source metal electrode 1.

The control gate electrode of the device shown in this figure is divided into two parts of first electrode 2a and second electrode 2b. The second source electrode 3 passes through between the first electrode 2a and the second electrode 2b and is directly connected to the source metal electrode 1 at the top of the device. Comparing with the complete control gate structure shown in FIG. 8, the manufacturing process of the gate structure of the device is simpler, and the extraction of the electrodes is more convenient.

Embodiment 9

Figure 13:
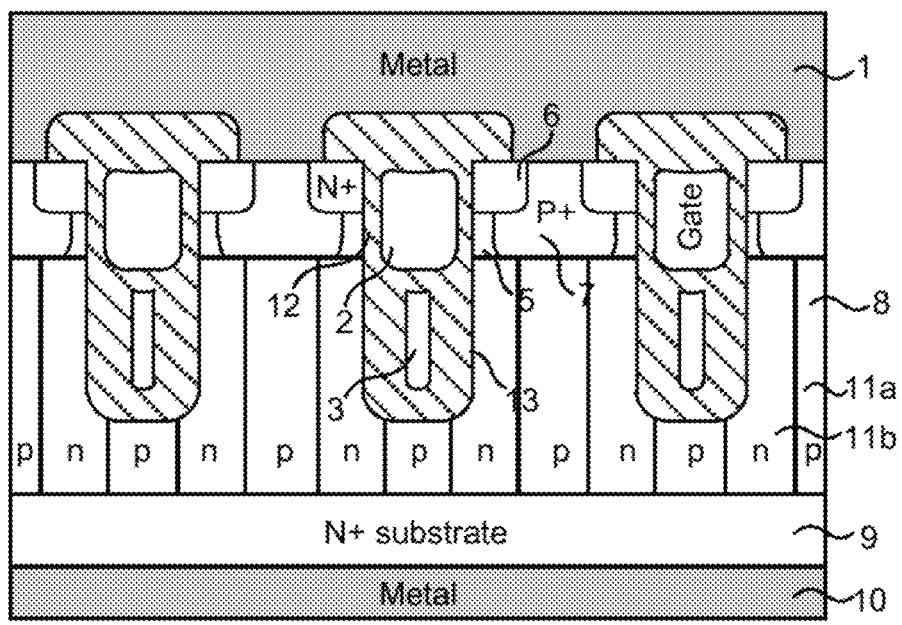
FIG. 13 is a schematic diagram of a split gate trench gate VDMOS device with super junction used in the drift region of Embodiment 9 according to the present invention.

As shown in FIG. 13, the difference between the present embodiment and Embodiment 1 lies in that the second source electrode 3 is disposed below the control ante electrode 2 in the dielectric layer 13. In the first conductivity type semiconductor drift region 8, alternately distributed second conductivity type strip region 11a and first conductivity type strip region 11b are provided.

FIG. 13 shows a structure diagram of a split gate trench gate VDMOS device using a super-junction drift region proposed by the present invention. The first conductivity type semiconductor drift region 8 of the device shown in this figure includes the second conductivity type strip region 11a and the first conductivity type strip region 11b; the doping concentrations of both the second conductivity type strip region 11a and the first conductivity type strip region 11b satisfy the charge balance condition, and both constitute a super junction structure, compared with the device shown in FIG. 8, the on-resistance of the device is reduced.

Embodiment 10

Figure 14:
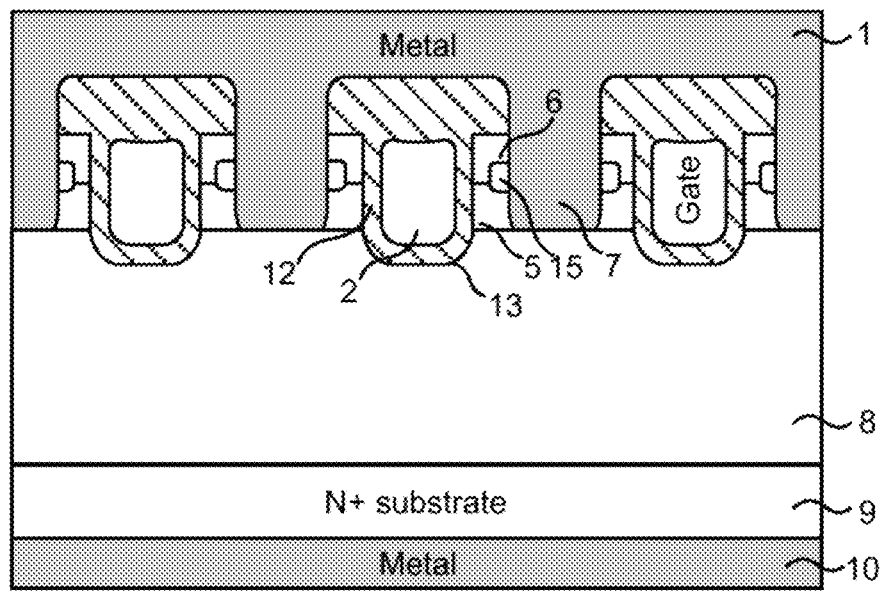
FIG. 14 is a schematic diagram of a trench gate VDMOS device of Embodiment 10 according to the present invention.

As shown in FIG. 14, the difference between the present embodiment and Embodiment 1 lies in that the anti-punch-through structure 7 is a metal structure, and the second conductivity type semiconductor body region 5 is internally provided with a short-circuited region 15, the short-circuited region 15 is in contact with the first conductivity type semiconductor source region 6 and the metal structure.

The difference between the device shown in this figure and the device shown in FIG. 5 lies in that the device includes a metal structure, the top of the metal structure is connected the source metal electrode 1 and penetrates through the second conductivity type semiconductor body region 5. When the distance between the metal structure and the silicon/gate dielectric is properly designed, the metal structure can clamp the low potential to the body/drift region junction under the device off-state operating conditions, and cooperate with low potential control gate electrode 2 to form a parasitic JFET region in the second conductivity type semiconductor body region 5. The introduction of the parasitic JFET region greatly reduces devices punch-through current, thereby increasing the devices anti-punch-through capability. At the same time, the bottom of the metal structure is connected with the first conductivity type semiconductor drift region 8 to form a Schottky contact, which can improve the reverse recovery characteristics of the devices body diode.

Embodiment 11

Figure 15:
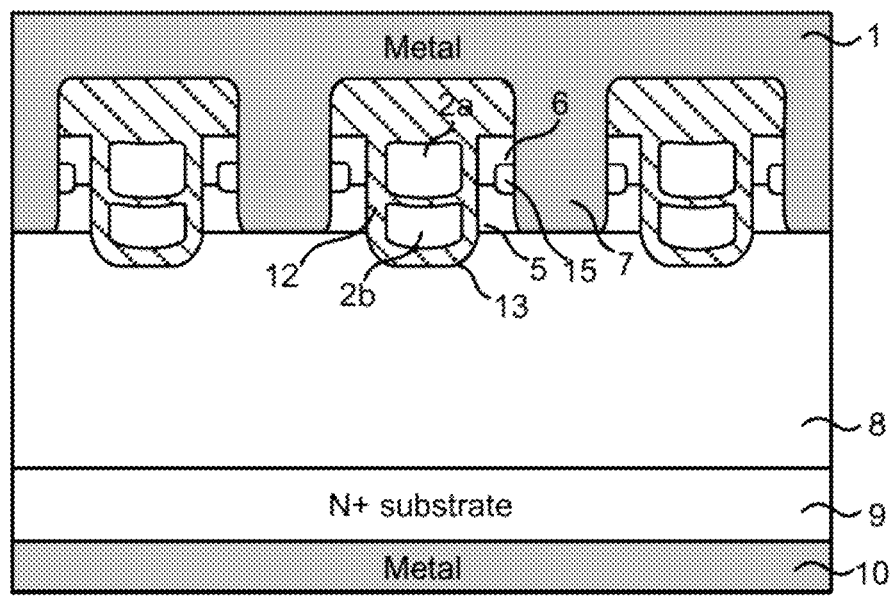
FIG. 15 is a schematic diagram of a trench gate VDMOS device with separated gate structure of Embodiment 11 according to the present invention.

As shown in FIG. 15, the anti-punch-through structure 7 in the present embodiment is a metal structure. The difference between the present embodiment and Embodiment 10 lies in that the control gate electrode is divided into a first electrode 2a and a second electrode 2b.

FIG. 15 shows a structure diagram of a trench gate VDMOS device with separated gate structure proposed in present embodiment. A suitable distance between control gate electrodes is selected to form a complete inversion layer channel on state of the device to ensure the device conduction. Due to the existence of a certain distance between the two control gates, compared with the complete control gate structure shown in FIG. 14, the overlap area of the gate and the body region is smaller, thereby reducing the parasitic capacitance between the gate and the body region.

Embodiment 12

Figure 16:
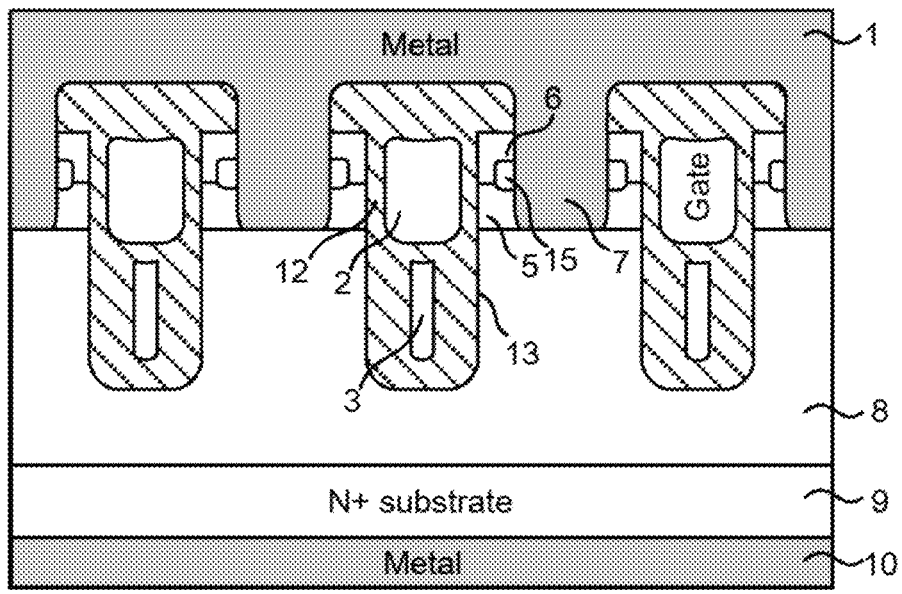
FIG. 16 is a schematic diagram of a split gate trench gate VDMOS device of Embodiment 12 according to the present invention.

As shown in FIG. 16, in the present embodiment, the anti-punch-through structure 7 is a metal structure. The difference between the present invention and Embodiment 10 lies in that the second source electrode 3 is disposed below the control gate electrode 2 in the dielectric layer 13.

FIG. 16 shows a schematic diagram of a split gate trend gate VDMOS device proposed in the present embodiment. The device uses a deep trench and a split gate structure based on the device shown in FIG. 13. The control gate electrode 2 in the dielectric layer 13 and the second source electrode 3 deep in the drift region are isolated from each other by the dielectric layer; under the off-state operation conditions, since the second source electrode 3 will introduce a high electric field peak in the drift region, a portion of the deep trench extending into the drift region uses a thicker lateral dielectric and a bottom dielectric layer to prevent avalanche breakdown of the device in the overlapping region between the first conductivity type semiconductor drift region 8 and the second source electrode 3. The high electric field peak generated in the drift region by the second source electrode 3 also makes the electric field distribution of the drift region more uniform under the off-state operating condition; compared to the device structure shown in FIG. 14, the second source electrode 3 shields the capacitive coupling effect between the control gate electrode 2 and the first conductivity type semiconductor drift region 8 and the parasitic gate-drain capacitance $C_{GD}$ is further reduced.

Embodiment 13

Figure 17:
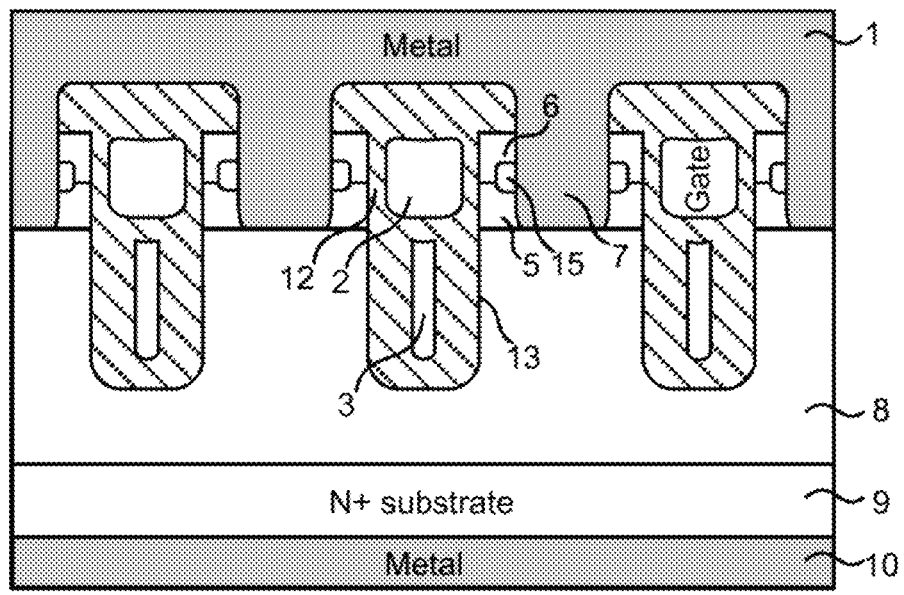
FIG. 17 is a schematic diagram of a split gate trench gate VDMOS device that gate bodies are not completely overlapped of Embodiment 15 according to the present invention.

As shown in FIG. 17, the anti-punch-through structure 7 of the present embodiment is a metal structure. The difference between the present embodiment and Embodiment 10 lies in that the second source electrode 3 is disposed below the control gate electrode 2 in the dielectric layer 13. The lower surface of the control gate electrode 2 is higher than the upper surface of the first conductivity type semiconductor drift region 8.

FIG. 17 shows a schematic diagram of a split gate trench gate VDMOS device with a gate both not completely overlapped in the present embodiment. The difference between the structure and the device shown in FIG. 16 is that the control gate electrode 2 of the device shown in FIG. 17 does not completely cover the channel region. Because the device proposed by the present invention has a low doping concentration in the channel region, the gate structure can still form a complete inversion layer channel in the body region to make the device conductive under the on state operating condition. Compared with the device shown in FIG. 16, the overlap area between the gate and the channel region is further reduced by introducing a shorter control gate electrode 2, thereby reducing the gate-source parasitic capacitance of the device; the short control gate electrode 2 simultaneously increases the distance between the gate and the drift region, further reducing the gate-drain parasitic capacitance $C_{GD}$.

Embodiment 14

Figure 18:
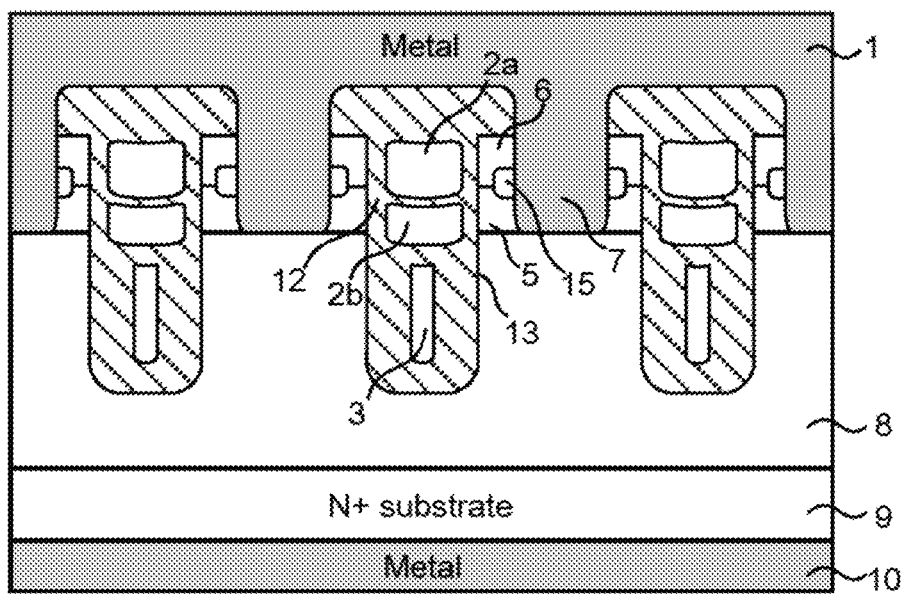
FIG. 18 is a schematic diagram of a split gate trench gate VDMOS device with separated gate structure of Embodiment 14 according to the present invention.

As shown in FIG. 18, the anti-punch-though structure 7 of the present embodiment is a metal structure. The difference between the present embodiment and Embodiment 10 lies in that the control gate electrode is divided into a first electrode 2a and a second electrode 2b. A second source electrode 3 is disposed below the control gate electrode 2 of the dielectric layer 13.

FIG. 18 shows a schematic diagram of a split gate trench gate VDMOS device with separated gate structure proposed in this embodiment. The difference between the structure of the device and the device show in FIG. 16 lies in that the control gate electrode is divided into two parts of first electrode 2a and second electrode 2b, both two control gates are connected to the same gate potential. Selecting a suitable distance between the two control gates can form a complete inversion layer channel in the on-state to ensure the device conduction. Because there is a certain distance between the two control gates, compared with the complete control gate structure shown in FIG. 16, the overlap area between the gate and the body region is smaller, thereby reducing the parasitic capacitance between the gate and the body region.

Embodiment 15

Figure 19:
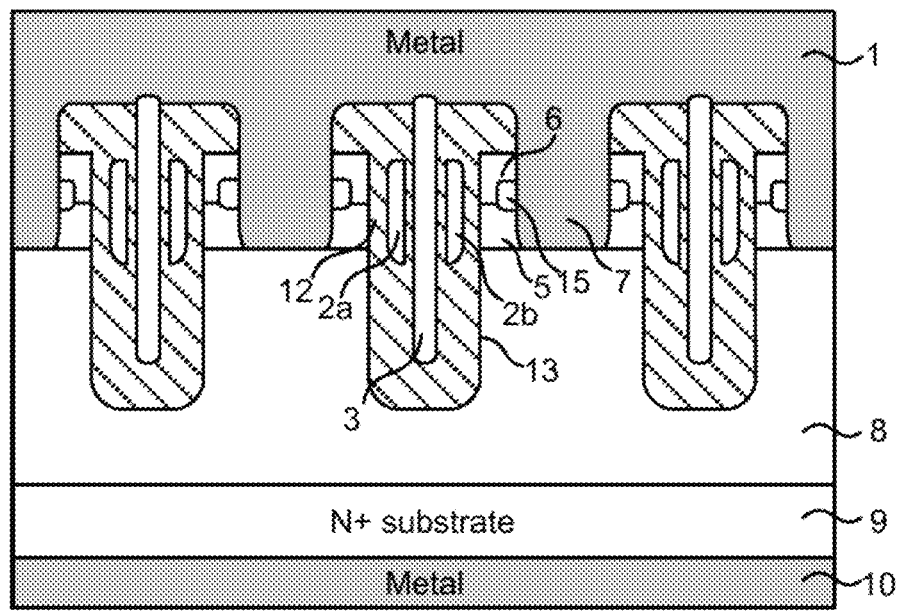
FIG. 19 is a schematic diagram of a trench gate VDMOS device of Embodiment 15 according to the present invention.

As shown in FIG. 19, the anti-punch-through structure 7 of the present embodiment is a metal structure. The difference between the present embodiment and Embodiment 10 lies in that a second source electrode 3 is disposed below the control gate electrode 2 of the dielectric layer 13, and the control gate electrode is divided into the first electrode 2a and the second electrode 2b, the upper surface of the second source electrode 3 is in contact with the source metal electrode 1.

FIG. 19 shows a schematic diagram of a trench gate VDMOS device proposed in the present embodiment. The difference between the structure of the device shown in FIG. 19 and that shown in FIG. 16 is that the control gate electrode is divided into two parts, namely, the first electrode 2a and the second electrode 2b. The second source electrode 3 passes through between the first electrode 2a and the second electrode 2b and are directly connected to the source metal electrode 1 at the top of the device. Compared with the complete control gate structure shown in FIG. 16, the manufacturing process of the gate structure of the device is simpler, and the extraction of the electrodes is more convenient.

Embodiment 16

Figure 20:
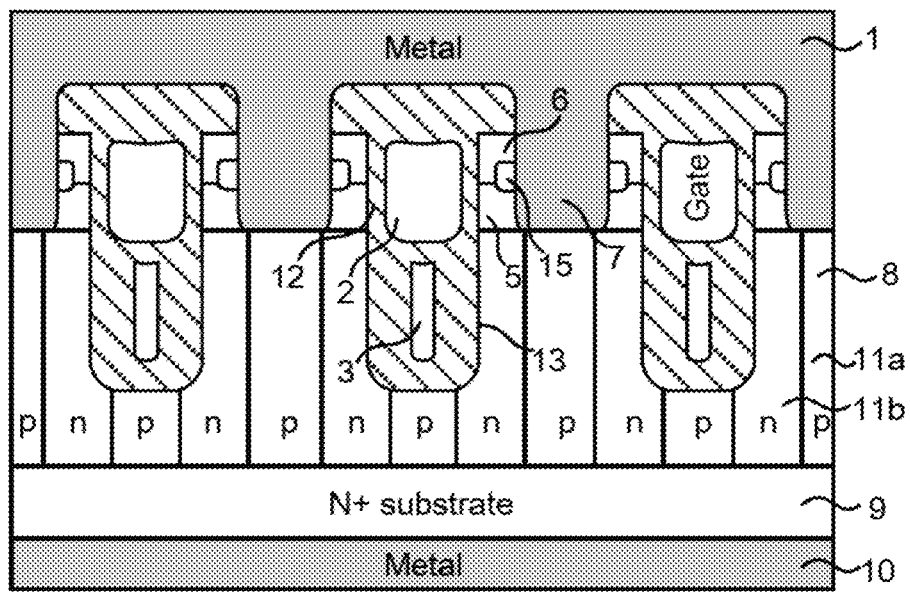
FIG. 20 is a schematic diagram of a split gate trench gate VDMOS device with super junction used in the drift region of Embodiment 16 according to the present invention.

As shown in FIG. 20, the anti-punch-through structure 7 of the present embodiment is a metal structure. The difference between the present embodiment and Embodiment 10 lies in that the second source electrode 3 is disposed below the control gate electrode 2 in the dielectric layer 13. In the first conductivity type semiconductor drift region 8, alternately distributed second conductive type strip region 11a and first conductive type strip region 11b are provided.

FIG. 20 shows a schematic diagram of a split gate trench gate VDMOS device with super junction used in the drift region proposed by the present invention. The difference between the structure of the device shown in this figure and the structure of the device shown in FIG. 16 lies in that the first conductivity type semiconductor drift region 8 of the device includes a second conductivity type strip region 11a and a first conductivity type strip region 11b. The doping concentrations of both the second conductivity type strip region 11a and the first conductivity type strip region 11b satisfy the charge balance condition, and both constitute a super junction. Compared to the device shown in FIG. 16, the devices on-resistance is reduced.

Embodiment 17

The proposed device structure and the design concept applied to the vertical power device are equally applicable to the lateral power devices and the wider filed of power devices. The anti-punch-through structure introduced at the source end of the vertical power device can clamp the low potential to the body/drift region junction when the device is in off state, and acts together with a low potential control gate electrode to form a parasitic JFET region in the body region of the device. The introduction of the parasitic JFET region greatly reduces the device's punch-through current, thereby improving the devices anti-punch-through capability, and preventing device punch-through in the case of short channel and light-doped body regions. Reusing the low gate source overlapping area brought by the short channel and combining the thick gate dielectric layer to further reduce the gate parasitic capacitance. This design concept can also be applied to lateral power devices such as LDMOS devices to increase device's switching speed and improve device's dynamic characteristic.

Figure 21:
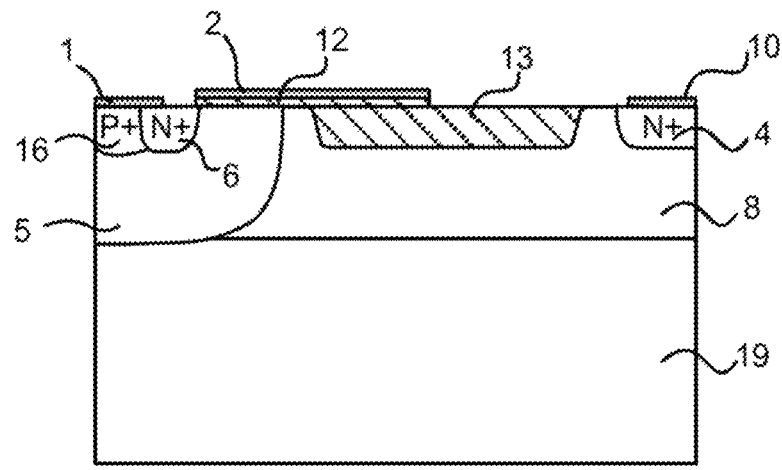
FIG. 21 is a schematic diagram of a conventional planar gate LDMOS device.

FIG. 21 shows a schematic, diagram of a conventional planar gate LDMOS device. The structure includes a second conductivity type semiconductor substrate 19 having a first conductivity type semiconductor drift region 8 on the upper surface. On the right side of the first conductivity type semiconductor drift region 8, a high-doped first conductivity type drain contact region 4 is disposed, and the high-doped first conductivity type drain contact region 4 is connected to the drain metal electrode 10 at the top. On the left side of the first conductivity type semiconductor drift region 8, a second conductivity type semiconductor body region 5 is disposed. On the surface of the first conductivity type semiconductor drift region 8, a dielectric layer 13 with STI structure is disposed. A conductivity type semiconductor source region 5 and an anti-punch-through structure 7 are disposed inside the second conductivity semiconductor body region 5; the first conductivity type semiconductor source region 6 and the anti-punch-through structure 7 are short-circuited by the source metal electrode 1; a gate dielectric 12 is disposed on the upper surface of the second conductivity type semiconductor body region 5, the control gate electrode 2 is obtained by depositing polysilicon on the gate dielectric 12, and the region of the second conductivity type semiconductor body region 5 near the gate dielectric 12 and between the first conductivity type semiconductor source region 6 and the first conductivity type semiconductor drift region 8 is the conduction channel region when the device is turned on.

The structure of the conventional planar gate LDMOS device is shown in FIG. 21. The control gate electrode 2 covers part of the first conductivity type semiconductor drift region 8 and part of the dielectric layer 13. A portion of the control gate electrode covering the first conductivity type semiconductor drift region 8 can attract majority carriers in the drift region when the device is in on state to form a multi-sub accumulation layer, thereby reducing the on-resistance of the device. The control gate electrode covering the dielectric layer 13 can introduce a high electric field in the first conductivity type semiconductor drift region 8, thereby optimizing the electric field distribution on the device surface, and increasing the off-state withstand voltage of the device. However, due to the overlap between the control gate electrode 2 and the first conductivity type semiconductor drift region 8, the conventional planar gate LDMOS device shown in FIG. 21 has a large gate-drain parasitic capacitance $C_{GD}$, which increases the switching time of the device and increases the dynamic power consumption of the device.

Figure 22:
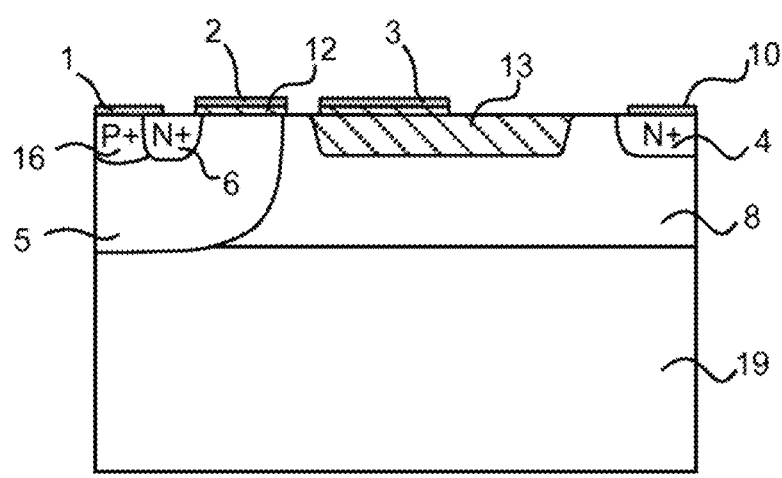
FIG. 22 is a schematic diagram of a split gate LDMOS device.

FIG. 22 shows a schematic diagram of a LDMOS device using split gate. The difference between the structure of the device shown in FIG. 22 and the structure shown in FIG. 21 lies in that after the polysilicon gate electrode is deposited, etching the control gate electrode 2 to disconnect the part of the control gate electrode covering the first conductivity type semiconductor drift region 8, thereby form the control gate electrode 2 and the second source electrode 3. In the split gate structure, the control gate electrode 2 does not cover the drift region, so the gate-drain parasitic capacitance $C_{GD}$ is greatly improved, and switching time and dynamic power consumption are significantly reduced. Secondly, the second source electrode 3 can shield the capacitive coupling effect between the control gate electrode 2 and the first conductivity type semiconductor drift region 8 to further reduce the gate-drain parasitic capacitance $C_{GD}$. However, in the on-state, the control gate electrode 2 cannot generate a multi-sub accumulation layer on the surface of the first conductivity type semiconductor drift region 8, and thus the on-resistance of the device is increased compared to the device shown in FIG. 22.

Figure 23:
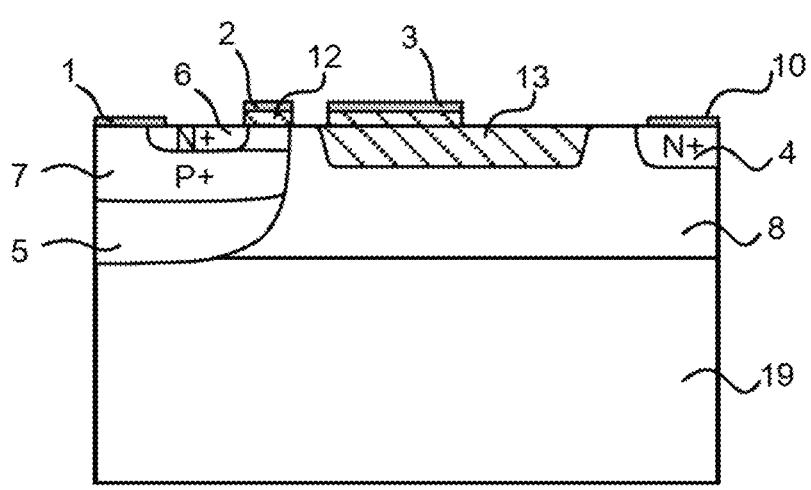
FIG. 23 is a schematic diagram of a split gate LDMOS device of Embodiment 17 according to the present invention.

FIG. 23 shows a power semiconductor device of the present embodiment, including a second conductivity type semiconductor substrate 19 having a first conductivity type semiconductor drift region 8 on the upper surface. On the right side of the first conductivity type semiconductor drift region 8, a first conductivity type drain contact region 4 is disposed, and the first conductivity type drain contact region 4 is connected to the drain metal electrode 10 at the top. On the left side of the first conductivity type semiconductor drift region 8, a second conductivity type semiconductor body region 5 is disposed. On the surface of the first conductivity type semiconductor drift region 8, a dielectric layer 13 is disposed. A conductivity type semiconductor source region 6 and an anti-punch-through structure 7 are disposed inside the second conductivity type semiconductor body region 5; the anti-punch-through structure 7 is a second conductivity type semiconductor body contact region, and the right boundary of the anti-punch-through structure 7 and the right boundary of the second conductivity type semiconductor body region 5 are coincident or the distance between the two is less than 0.5 μm; the first conductivity type semiconductor source region 5 and the anti-punch-through structure 7 are short-circuited by the source metal electrode 1; a gate dielectric 12 is disposed to the upper surface of the second conductivity type semiconductor body region 5, and the region of the second conductivity type semiconductor body region 5 near the gate dielectric 12 and between the first conductivity type semiconductor source region 6 and the first conductivity type semiconductor drift region 8 is the conduction channel region when the device is turned on. The length of the conduction channel region is less than 0.5 μm. The control gate electrode 2 and the second source electrode 3 are respectively disposed on the gate dielectric 12 and the dielectric layer 13. The potential of the source electrode 3 is substantially equivalent to the potential of the source metal electrode 1. The doping concentration of the second conductivity type semiconductor body region 5 is less than $10^{15}$ $cm^{-3}$; the thickness of the gate dielectric 12 between the control gate electrode 2 and the second conductivity type semiconductor body region 5 is greater than 0.05 μm.

The above-mentioned embodiment only demonstrates the principle and effect of the present invention, and not intend to limit the invention. Those skilled in the art may modify or alter the embodiment without departing from the spirit and scope of the invention. Therefore, all equivalent modifications or changes made by persons of ordinary skill in the art without departing from the spirit and technical thought disclosed in the present invention shall still be covered by the claims of the present invention.

What is claimed is:

1. A power semiconductor device, comprising:
a first conductivity type semiconductor substrate,
a drain metal electrode connected to a bottom of the first conductivity type semiconductor substrate and located at a bottom of the power semiconductor device,
a first conductivity type semiconductor drift region disposed on an upper surface of the first conductivity type semiconductor substrate,
a second conductivity type semiconductor body region disposed on an upper surface of the first conductivity type semiconductor drift region, and
a first conductivity type semiconductor source region and an anti-punch-through structure disposed inside the second conductivity type semiconductor body region; wherein
the anti-punch-through structure is a second conductivity type semiconductor body contact region;
a source metal electrode disposed on a surface of the power semiconductor device connects the first conductivity type semiconductor source region and the anti-punch-through structure,
a lower surface of the anti-punch-through structure coincides with the upper surface of the first conductivity type semiconductor drift region or a distance between the lower surface of anti-punch-through structure and the upper surface of the first conductivity type semiconductor drift region is less than 0.5 μm to prevent punch-through breakdown,
a dielectric layer extends through the second conductivity type semiconductor body region and into the first conductive type semiconductor drift region,
a control gate electrode is disposed in the dielectric layer,
a gate dielectric is formed by the dielectric layer between the control gate electrode and the second conductivity type semiconductor body region and the first conductivity type semiconductor drift region, and
a distance between the anti-punch-through structure and the gate dielectric is less than 0.3 μm; and a thickness of the gate dielectric between the control gate electrode and the second conductivity type semiconductor body region and the first conductivity type semiconductor drift region is greater than 0.05 μM.

2. The power semiconductor device according to claim 1, wherein a doping concentration of the second conductivity type semiconductor body region is less than $10^{15}$ $cm^{-3}$.

3. The power semiconductor device according to claim 1, wherein a part of the second conductivity type semiconductor body region between the first conductivity type semiconductor source region and the first conductivity type semiconductor drift region and below the gate dielectric forms a conduction channel region when the power semiconductor device is turned on, and a length of the conduction channel region is less than 0.5 μm.

4. The power semiconductor device according to claim 1, wherein an upper surface of the control gate electrode is not higher than a lower surface of the first conductivity type semiconductor source region; and/or a lower surface of the control gate electrode is not lower than the upper surface of the first conductivity type semiconductor drift region.

5. The power semiconductor device according to claim 1, wherein when the anti-punch-through structure is a metal structure, a short-circuited region is disposed inside the second conductivity type semiconductor body region, and the short-circuited region is in contact with the first conductivity type semiconductor source region and the metal structure.

6. The power semiconductor device according to claim 1, wherein a second source electrode is disposed below the control gate electrode of the dielectric layer.

7. The power semiconductor device according to claim 6, wherein a lower surface of the control gate electrode is higher than the upper surface of the first conductivity type semiconductor drift region.

8. The power semiconductor device according to claim 2, wherein a second source electrode is disposed below the control gate electrode of the dielectric layer.

9. The power semiconductor device according to claim 6, wherein the control gate electrode is divided into a first electrode and a second electrode; an upper surface of the second source electrode is in contact with the source metal electrode.

10. The power semiconductor device according to claim 6, wherein an alternately distributed second conductivity type strip region and a first conductivity type strip region are provided in the first conductivity type semiconductor drift region.

* * * * *